(12) United States Patent
Ribeiro

(10) Patent No.: US 6,612,460 B2
(45) Date of Patent: Sep. 2, 2003

(54) PLUG FOR COVERING AN OPENING OF AN ELECTRONIC DEVICE

(75) Inventor: Durval S. Ribeiro, Owatonna, MN (US)

(73) Assignee: SPX Corporation, Muskegon, MI (US)

( * ) Notice: Subject to any disclaimer, the term of this patent is extended or adjusted under 35 U.S.C. 154(b) by 0 days.

(21) Appl. No.: 09/750,462

(22) Filed: Dec. 28, 2000

(65) Prior Publication Data

US 2003/0071046 A1 Apr. 17, 2003

(51) Int. Cl.⁷ ............................................... B65D 39/00
(52) U.S. Cl. ............... 220/787; 220/324; 220/DIG. 19; 174/50; 312/223.2
(58) Field of Search .............................. 138/89; 361/825; 361/679; 220/DIG. 19, 787, 793, 789, 791, 323, 324, 212.5, 3.8, DIG. 20, DIG. 21, DIG. 13, 601, 780, 242; 70/58; 174/50; 439/136; 215/295, 296, 298, 305; 312/223.2

(56) References Cited

U.S. PATENT DOCUMENTS

| | | | | |
|---|---|---|---|---|
| 4,413,748 A | * | 11/1983 | Kessler et al. | 220/212.5 |
| 4,655,057 A | * | 4/1987 | Derman | 360/137 |
| 4,908,728 A | * | 3/1990 | Pinkett | 70/58 |
| 4,964,286 A | * | 10/1990 | Poyer | 70/58 |
| 5,076,461 A | * | 12/1991 | Nichols | 220/787 |
| 5,114,036 A | * | 5/1992 | Liu | 220/787 |
| 5,135,126 A | * | 8/1992 | Petit | 220/324 |
| 5,199,888 A | * | 4/1993 | Condra et al. | |
| D347,227 S | * | 5/1994 | Ernst et al. | D14/239 |
| 5,503,189 A | * | 4/1996 | Lamendola | 138/89.3 |
| 5,601,349 A | * | 2/1997 | Holt | |
| 5,626,252 A | * | 5/1997 | Trotman | 220/789 |
| 5,640,309 A | * | 6/1997 | Carney et al. | |
| 5,748,453 A | * | 5/1998 | Carney et al. | |
| 5,820,236 A | * | 10/1998 | Aoki | 312/223.2 |
| 6,051,788 A | * | 4/2000 | Nichols | 312/223.2 |
| RE36,695 E | * | 5/2000 | Holt | 312/265.6 |
| 6,097,594 A | * | 8/2000 | Bassett et al. | 361/683 |
| 6,462,278 B1 | * | 10/2002 | Vrame | 220/242 |

* cited by examiner

Primary Examiner—Robin Hylton
(74) Attorney, Agent, or Firm—Baker & Hostetler LLP

(57) ABSTRACT

A plug for covering an opening of an electronic device includes an elongated member and either one protruding member containing two tabs or two protruding members, each containing one tab. The elongated member and protruding members are sized and positioned to substantially fill or cover an opening of an electronic device. Preferably, the plug also includes two gripping wings to facilitate insertion of the plug into the opening and removal of the plug from the opening.

15 Claims, 2 Drawing Sheets

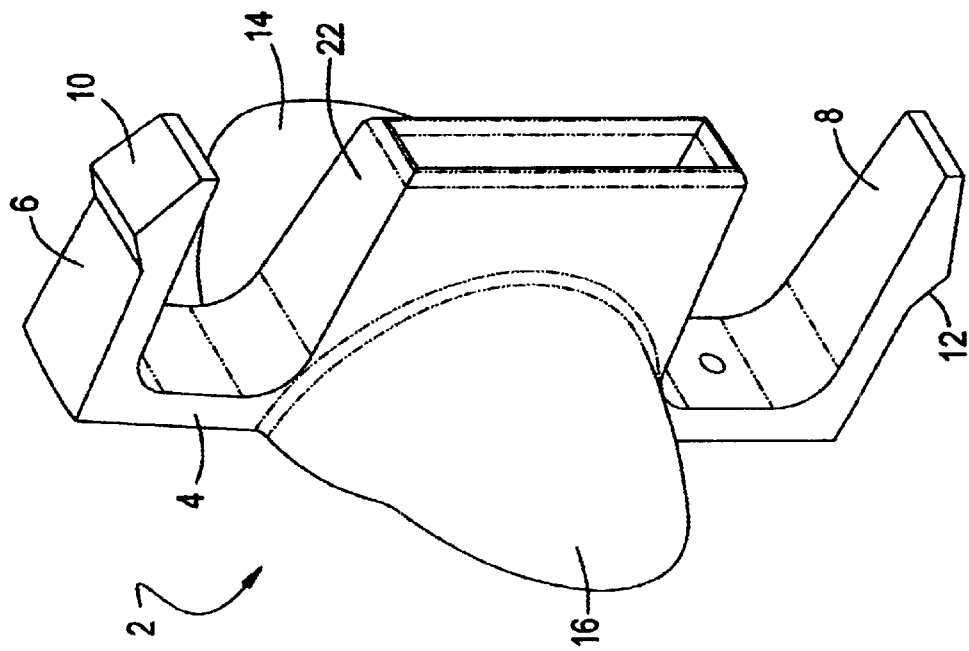
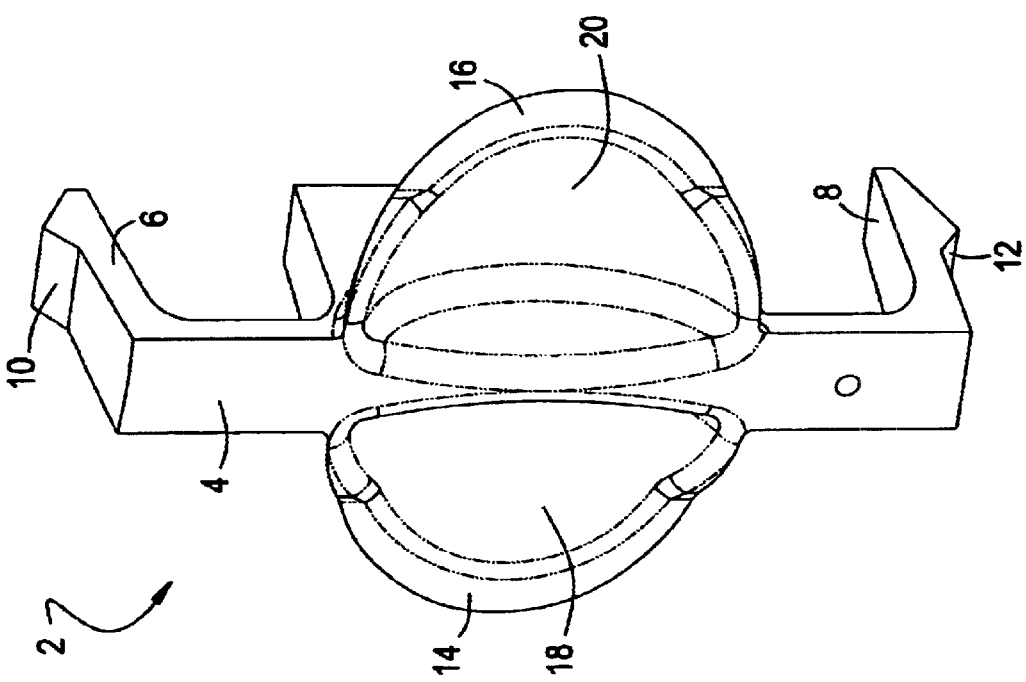

PLUG FOR COVERING AN OPENING OF AN ELECTRONIC DEVICE

FIELD OF THE INVENTION

The present invention generally relates to covers and plugs associated with electronic devices. More particularly, the present invention relates to a plug or cover for an opening in an electronic device, such as a card opening or a disk drive opening, to help prevent or minimize the likelihood that contaminants will enter into the electronic device through the opening.

BACKGROUND OF THE INVENTION

Electronic devices, such as personal computers, portable computers, diagnostic equipment or analyzers, testing devices, electronic games, remote controls, pocket computers, palms, and other devices are often manufactured such that the housing of the device includes one or more ports or openings that allow for the insertion of items into the device. Such an opening may be, for example, a floppy disk or CD ROM drive opening. Alternatively, the opening may be for the insertion of an expansion card, a modem card, a memory card, or any type of card or other device which may add functionality to the device and/or allow for a removable storage medium for data collected and/or used by the device. When a card, disc, or other item is not inserted into such a port or opening, the opening typically provides an area through which undesired contaminants, such as dust, dirt, or liquids, may enter into the device and damage the device. This potential for contamination is a particular problem in industrial and maintenance environments, such as automobile repair shops, where dirt, grease, and oil are present and may frequently come into contact with the electronic device.

Prior art attempts to prevent contaminants from entering into electronic device ports are disclosed in, for example, U.S. Pat. No. 5,640,309, to Carney et al., which discloses an expansion card that includes a cover which blocks the opening after the card has been plugged in. A retainer clip is mounted on the device so that, when in operative position, the retainer is attached to the cover and engages the cover to assist holding the card in place. Similarly, U.S. Pat. No. 5,748,453, to Carney et al., discloses a blanking cover that covers a card opening when a card is not inserted into the opening. The blanking cover is held into place by a tongue receptor and a retainer track affixed to the housing of the electronic device.

Another example of a prior electronic device port cover may be found in U.S. Pat. No. 5,601,349, to Holt, which discloses a card guide retaining device having a first end extending within a computer chassis and second end extending to without the retainer aperture exterior to the computer chassis.

The prior art electronic device opening covers such as those disclosed in the Carney patents and the Holt patent have limited desirability because they are difficult to install and/or they do not provide a cover that substantially fills or seals the opening to minimize the possibility that contaminants will enter into the electronic device.

Accordingly, an improved plug for covering an opening of an electronic device is needed.

SUMMARY OF THE INVENTION

It is therefore an advantage of the present invention to provide an improved plug for covering an opening of an electronic device.

The above other features and advantages are achieved through a novel plug as herein disclosed. In accordance with one embodiment of the present invention, a plug for covering an opening of an electronic device includes an elongated member having a first opposing end and a second opposing end. The elongated member is sized to substantially cover or fill an opening of an electronic device such as a port or drive opening. The plug also includes a first projecting member that is attached to and extends from the first opposing end of the elongated member, as well as a second projecting member attached to and extending from the second opposing end of the elongated member. Each projecting member includes a raised tab. The raised tabs face away from each other, and each projecting member is positioned substantially perpendicular to the elongated member such that each projecting member and raised tab extends into the opening of the electronic device, and the tab engages with the electronic device, when the plug is inserted into the opening.

Preferably, the plug also includes two gripping wings positioned on opposite sides of the elongated member. Each gripping wing includes a recess sized to accept a typical human finger or thumb to allow for insertion of the plug into the electronic device, as well as gripping of the plug to pull it out of the electronic device. Each gripping wing is preferably sized and positioned to fill a recess located on the electronic device. Preferably, the entire plug, or at least each projecting member, is made of an elastomeric or plastic material having sufficient stiffness to hold the plug in the electronic device when the plug is inserted into the opening, but sufficient flexibility to allow the plug to be pulled from the electronic device with moderate amount of force. Preferably, the plug substantially seals the opening of the electronic device when the plug is inserted into the opening, thus minimizing the likelihood that contaminants will enter into the device.

In accordance with another embodiment of the present invention, a housing of an electronic device has an elongated opening, and a plug is sized and shaped to substantially seal the opening when the plug is inserted into the opening. The plug comprises an elongated member, a first projecting member, and a second projecting member. Each projecting member is attached to and extends from the elongated member and is positioned to be substantially perpendicular to the elongated member. In addition, each projecting member includes a tab positioned to engage with the electronic device when the plug is inserted into the opening. Preferably, the plug further includes two gripping wings positioned on opposite sides of the elongated member, and each gripping wing includes a recess that is sized and positioned to accept a typical human finger or thumb. Also preferably, the housing includes a first recess and a second recess positioned along the opening, and the gripping wings are sized and positioned to substantially fill each of the recesses on the housing. Preferably, the plug, or at least the first projection and the second projection, are made of an elastomeric or plastic material so that the plug may be inserted to or withdrawn from the opening with a moderate amount of force.

In accordance with an additional embodiment of the present invention, a cover for sealing an opening of an electronic device includes an elongated member sized to fit into an opening of an electronic device. A projecting member is attached to and protrudes from the elongated member. The projecting member includes at least two clips that engage with the opening to secure the plug into the electronic device when the plug is inserted into the opening. Two gripping wings are sized and positioned to accept a human finger or thumb, and each gripping wing is attached to and protrudes from the elongated member. Each gripping wing is positioned so that the gripping wings prevent the plug from completely entering the opening when the plug is inserted into the opening.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract set forth below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 1 is a perspective view of the features of various elements of a preferred embodiment of the present inventive plug.

FIG. 2 provides another perspective view of various elements of a preferred embodiment of the present inventive plug.

DETAILED DESCRIPTION OF PREFERRED EMBODIMENTS OF THE INVENTION

Figure 3:
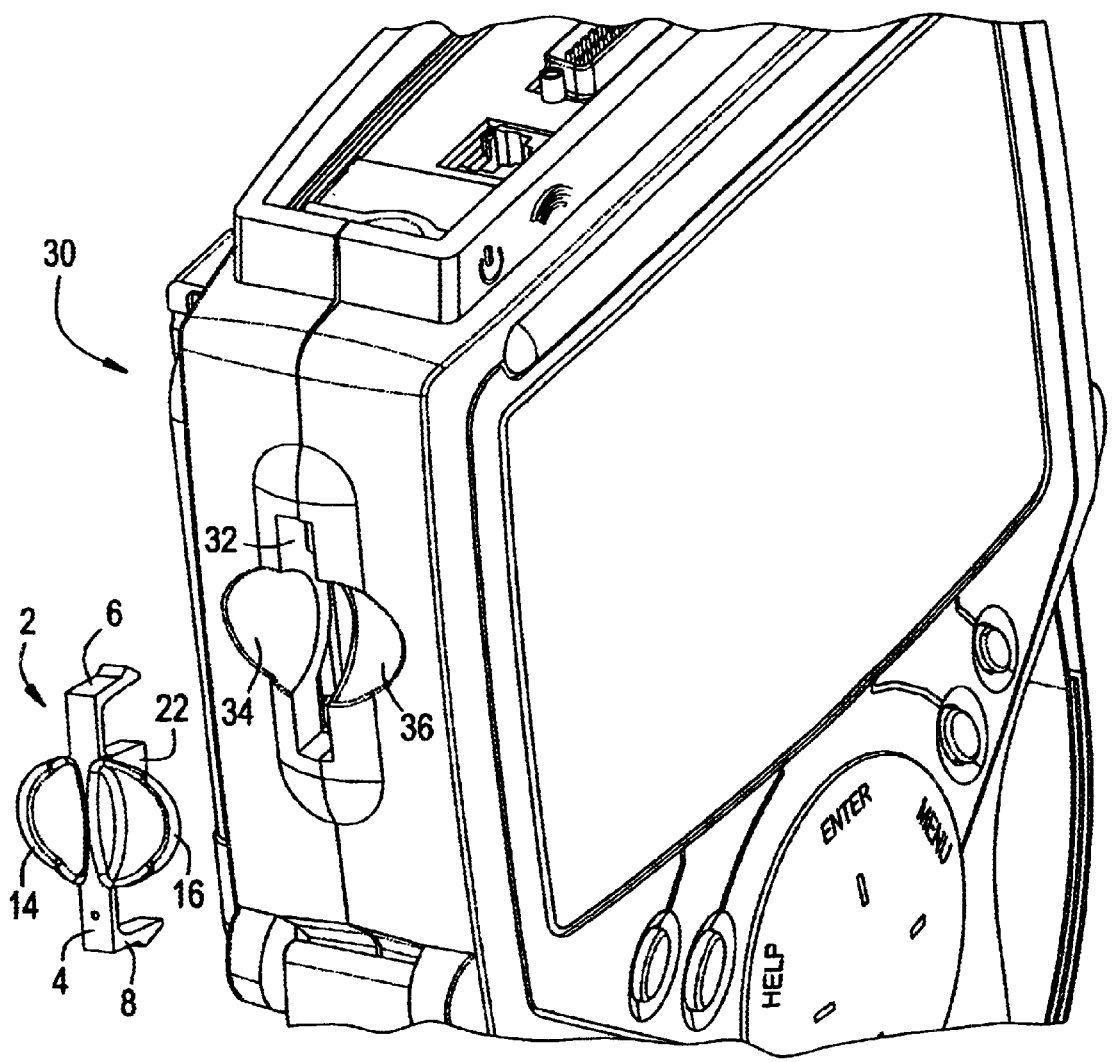
FIG. 3 provides a perspective view of a preferred embodiment of the present inventive plug in combination with an electronic device.

The present invention provides a novel apparatus and assembly for sealing or substantially sealing an opening, such as a card port or disk drive opening, of an electronic device.

A preferred embodiment of the present inventive plug is illustrated in FIG. 1. As illustrated in FIG. 1, an exemplary embodiment of the present inventive plug 2 includes an elongated member 4. Two fingers or protruding members 6 and 8 are attached to the elongated member 4 and positioned to be substantially perpendicular to the elongated member. Preferably, the fingers 6 and 8 are located at or near opposing ends of the elongated member 4. Each finger 6 and 8 includes a raised rib or tab 10 and 12. Preferably, each finger 6 and 8 and each tab 10 and 12, or even the entire plug 2, is made of an elastomeric material, such as hard rubber or a plastic that allows the fingers to be squeezed slightly or substantially inward for insertion into an opening of an electronic device. Optionally, instead of two protruding members a single protruding member may be used, and each of the ribs 10 and 12 are affixed to opposing ends of the protruding member. The raised ribs 10 and 12 include angular faces that also direct motion of the fingers when the plug 2 is inserted into an electronic device or removed from an electronic device. The angular faces cause the ribs 10 and 12 to be raised enough so that force must be applied to pull the plug 2 from the electronic device. Preferably, the amount of force required is moderate to a human of ordinary strength, but is still sufficient such that the plug will not dislodge from the unit under normal operation.

FIG. 1 also illustrates two gripping wings 14 and 16 that are attached to opposite sides of the elongated member 4. The gripping wings project away from the elongated member. Each wing includes a finger recess 18 and 20 that is sized and positioned to accept an ordinary human finger and/or thumb so that an ordinary human may grip the plug to place it into to an electronic device or remove the plug from an electronic device.

FIG. 2 provides another perspective view of the plug 2 that was illustrated in FIG. 1. As this view illustrates, the wings 14 and 16 are preferably solid on the underside to facilitate covering the opening when the plug is inserted into the unit. Although FIG. 2 illustrates a curved underside, the wings may actually be made of any shape, including a flat shape, corresponding to the design of the electronic device into which the plug 2 is to be inserted. The wings 14 and 16 prevent the plug from completely entering the device through the opening when the plug is inserted into the opening. FIG. 2 also illustrates an optional stabilization rib 22 sized and positioned to further secure the plug into the opening of an electronic device when the plug is inserted into the opening. As noted above, instead of two protruding members the plug may optionally include a single protruding member. In such an embodiment, the single protruding member may also serve as a stabilization rib.

FIG. 3 provides a view of the present inventive plug 2 corresponding to its combination with an exemplary electronic device 30. The electronic device 30 illustrated in FIG. 3 is a hand held vehicle engine analyzer having an opening 32 designed to accept an external memory card. However, the electronic device may be any type of device, such as a personal computer, a laptop computer, a video game device, a pocket PC or palm device, any type of analyzer or diagnostic testing equipment, a remote control, or any other type of device. The electronic device 30 includes a port or opening 32 that allows for insertion of materials into the device. Such a port or opening 32 may be, for example, a memory card port, a modem card port, a disk drive opening, or any type of opening, or port that may be found on an electronic device.

The device 30 illustrated in FIG. 3 also includes recessed areas 34 and 36 located along the opening, and the wings 14 and 16 of the plug are sized and positioned to substantially fill the recessed areas. The recessed areas, however, are in fact optional, and the present invention may be designed to such that the wings 14 and 16 are flat and merely are placed on top of the housing of the electronic device while the ribs such as 6 and 8 are inserted into the opening. In FIG. 3 the ribs 6 and 8 are sized and positioned such that when they are inserted into the opening they engage the opening and secure the plug to the electronic device. The elongated member 4 is sized to substantially fill the opening 32 of the electronic device, and optional rib 22 also fits within the opening, such that the various elements of the plug 2 substantially fill all portions of opening 32, thus creating a substantial seal and helping to prevent contaminants from entering the device.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A plug for covering an opening of an electronic device comprising:
    an elongated member having a first opposing longitudinal end and a second opposing longitudinal end, said elongated member sized to substantially cover or fill an opening of an electronic device;
    a first projecting member attached to and extending from the first opposing longitudinal end of the elongated member and a second projecting member attached to and extending from the second opposing longitudinal end of the elongated member, the first projecting member including a raised tab facing a direction opposing the second projecting member, the second projecting member including a raised tab facing a direction opposing the first projecting member, each projecting member positioned substantially perpendicular to the elongated member and sized so that the raised tab of each projecting member is capable of extending into the opening of the electronic device to engage with the electronic device when the plug is inserted into the opening; and
    a first gripping wing and a second gripping wing positioned on opposite sides of the elongated member, each gripping wing including a recess sized to accept a human finger or thumb.

2. The plug of claim 1 wherein the first gripping wing is sized and positioned to substantially fill a first recess located on the electronic device, and the second gripping wing is sized and positioned to substantially fill a second recess located on the electronic device.

3. The plug of claim 1 wherein the first projecting member and the second projecting member are comprised of an elastomeric material.

4. The plug of claim 1 wherein the first projecting member and the second projecting member are comprised of a plastic material.

5. The plug of claim 1 wherein the plug, when inserted into the opening of the electronic device, substantially seals the opening of the electronic device.

6. In combination, a housing of an electronic device having an elongated opening and a plug sized and shaped to substantially seal the opening when inserted into the opening, wherein the plug comprises;
    an elongated member having opposing longitudinal ends;
    a first projecting member and a second projecting member, each projecting member attached to and extending from respective opposing longitudinal ends of the elongated member and positioned substantially perpendicular to the elongated member, each of the projecting members including a tab designed to be positioned within the opening to engage the electronic device when the plug is inserted into the opening; and
    a first gripping and a second gripping wing positioned on opposite sides of the elongated member, each gripping wing including a recess sized to accept a human finger or thumb.

7. The combination of claim 6 wherein the housing further includes a first recess and a second recess positioned along the opening, and the gripping wings are sized and positioned to substantially fill the first and second recesses.

8. The combination of claim 6 wherein the first projecting member and the second projecting member are comprised of an elastomeric or plastic material.

9. A plug for covering an opening of an electronic device, comprising:
    an elongated member having a first opposing longitudinal end and a second opposing longitudinal end, said elongated member sized to substantially cover or fill an opening of an electronic device;
    a first projecting member attached to and extending from the first opposing longitudinal end of the elongated member and a second projecting member attached to and extending from the second opposing longitudinal end of the elongated member, each projecting member positioned to enter the opening of the electronic device, each projecting member further including a means for securing the projecting member within the opening of the electronic device; and
    a means for gripping the plug, the means for gripping protruding from said elongated member sized to accepted at least one human finger or thumb wherein the means for gripping is further sized and positioned to substantially fill at least one recess located on the electronic device.

10. The plug of claim 9 wherein the first projecting member and the second projecting member are comprised of an elastomeric material.

11. The plug of claim 9 wherein the first projecting member and the second projecting member are comprised of a plastic material.

12. The plug of claim 9 wherein the plug, when inserted into the opening of the electronic device, substantially seals the opening of the electronic device.

13. The plug of claim 9 wherein the means for securing permits the plug to be inserted into and withdrawn from the device with moderate force.

14. A method of covering an opening of an electronic device comprising:
    providing an elongated member having a first opposing longitudinal end and a second opposing longitudinal end, said elongated member sized to substantially cover or fill an opening of an electronic device, the elongated member further having a first projecting member attached to and extending from the first opposing end of the elongated member and a second projecting member attached to and extending from the second opposing end of the elongated member, the first projecting member including a raised tab facing a direction opposing the second projecting member, the second projecting member including a raised tab facing a direction opposing the first projecting member, each projecting member positioned substantially perpendicular to the elongated member, the elongated member further having a first gripping wing and a second gripping wing positioned on opposite sides of the elongated member, each gripping wing including a recess sized to accepted a human finger or thumb; and
    inserting the raised tab of each projecting member into the opening to engage with the electronic device.

15. The method of claim 14, wherein the elongated member is handled via the first and second gripping wing during insertion.

\* \* \* \* \*